(12) United States Patent
Shan et al.

(10) Patent No.: US 9,658,485 B2
(45) Date of Patent: May 23, 2017

(54) DISPLAY PANEL, A DISPLAY DEVICE, AND FABRICATION METHOD THEREOF

(71) Applicants: Shanghai Tianma Micro-electronics Co., Ltd., Shanghai (CN); Tianma Micro-electronics Co., Ltd., Shenzhen (CN)

(72) Inventors: Wenze Shan, Shanghai (CN); Zhongshou Huang, Shanghai (CN); Zhaokeng Cao, Shanghai (CN); Chen Liu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/987,939

(22) Filed: Jan. 5, 2016

(65) Prior Publication Data

US 2016/0238885 A1    Aug. 18, 2016

(30) Foreign Application Priority Data

Feb. 13, 2015   (CN) .......................... 2015 1 0077228

(51) Int. Cl.
*G02F 1/1335*      (2006.01)
*H01L 27/12*       (2006.01)

(52) U.S. Cl.
CPC .. *G02F 1/133528* (2013.01); *G02F 1/133512* (2013.01); *H01L 27/124* (2013.01);
(Continued)

(58) Field of Classification Search
CPC .............. G02B 5/201; G02F 1/133514; G02F 1/134363; G02F 1/133528; H01L 27/124; H01L 27/1262
See application file for complete search history.

(56) References Cited

U.S. PATENT DOCUMENTS

| | | | | |
|---|---|---|---|---|
| 5,499,126 A | * | 3/1996 | Abileah | ............ G02F 1/133514 349/106 |
| 2001/0015783 A1 | * | 8/2001 | Ohta | ................. G02F 1/134363 349/141 |
| 2011/0242652 A1 | * | 10/2011 | Sahouani | ............... G02B 5/201 359/486.02 |

FOREIGN PATENT DOCUMENTS

CN    101051143 A    10/2007
CN    101075029 A    11/2007
(Continued)

*Primary Examiner* — Kenneth Parker
*Assistant Examiner* — Fang-Xing Jiang
(74) *Attorney, Agent, or Firm* — Anova Law Group, PLLC

(57) ABSTRACT

A display panel includes a first substrate, a second substrate corresponding to the first substrate, a plurality of color films formed on one side of the first substrate and dividing the first substrate into a plurality of color film regions and a plurality of light shielding regions, a first polarizer formed on the first substrate, and a second polarizer formed on the second substrate. The first polarizer includes a plurality of first regions corresponding to the color film regions and a plurality of second regions corresponding to the light shielding regions. The direction of the polarization axis of the second regions is different from the polarization direction of the first regions. The second polarizer is configured to be combined with the first polarizer to cause light passing through the second polarizer to be transmitted through the first regions and to be blocked by the second regions.

15 Claims, 6 Drawing Sheets

(52) U.S. Cl.
CPC ............... *H01L 27/1262* (2013.01); *G02F 2001/133531* (2013.01); *G02F 2001/133538* (2013.01)

(56) References Cited

FOREIGN PATENT DOCUMENTS

| | | |
|---|---|---|
| CN | 102707487 A | 10/2012 |
| CN | 104122703 A | 10/2014 |
| WO | 2014162798 A1 | 10/2014 |

\* cited by examiner

DISPLAY PANEL, A DISPLAY DEVICE, AND FABRICATION METHOD THEREOF

CROSS-REFERENCES TO RELATED APPLICATIONS

This application claims the priority of Chinese patent application No. 201510077228.5, filed on Feb. 13, 2015, the entirety of which is incorporated herein by reference.

FIELD OF THE INVENTION

The present invention generally relates to the field of display technology and, more particularly, relates to a display panel, a display device, and the fabricating process thereof.

BACKGROUND

Liquid crystal display panels and liquid crystal display devices are currently one of the main stream display technologies. Generally speaking, a display panel includes an upper substrate and a lower substrate. The upper substrate is called color film (CF) substrate while the lower substrate is called thin-film transistor (TFT) substrate. In a traditional liquid crystal display monitor, the CF substrate and the TFT substrate are bonded by frame glue to form a display panel.

Further, both the CF substrate and the TFT substrate of a liquid crystal display monitor have polarizers formed on the top. Each polarizer absorbs the light with a certain polarization direction while allows the transmission of the light with another polarization direction. During display, the rotation direction and the polarization state of the polarized light are controlled by tuning the rotation angles of liquid crystal molecules using an adjustable voltage applied on the liquid crystal. Thus, the amount of the light transmitted through the polarizer is controlled and, together with the CF substrate, the control of light transmission can be used to realize changes in the display state of the liquid crystal monitor.

On the TFT substrate, a number of pixel units are formed. In each pixel unit, there are multiple thin-film transistors. The amount of light transmitted through different pixel units is different. A number of color filter units are formed on the CF substrate for different colors, such as red, green, and blue. In practical applications, due to crosstalk between light beams of different pixel units on the TFT substrate, a black matrix (BM) is formed on the CF substrate to block leaked light between two neighboring pixel units.

The position of the BM on the CF substrate corresponds to the boundaries of neighboring pixel units on the TFT substrate. The BM is usually made of resin materials and a certain thickness, such as 1.1 µm-1.4 µm, is required to fully shield the light. However, because of the relatively large thickness of the BM, bulges may emerge from the overlapping areas between the BM and the color film, leading to a non-smooth surface of the CF substrate, and thus further causing problems such as abnormal alignment, light leaking, etc.

The disclosed methods and systems are directed to solve one or more problems set forth above and other problems in the art.

BRIEF SUMMARY OF THE DISCLOSURE

One aspect of the present disclosure provides a display panel. The display panel includes a first substrate and a second substrate arranged corresponding to the first substrate. The display panel further includes a plurality of color films formed on one side of the first substrate and dividing the first substrate into a plurality of color film regions and a plurality of light shielding regions. The display panel also includes a first polarizer formed on the first substrate and a second polarizer formed on the second substrate. The first polarizer includes a plurality of first regions corresponding to the color film regions and a plurality of second regions corresponding to the light shielding regions. The direction of the polarization axis of the second regions of the first polarizer is different from the polarization direction of the first regions of the first polarizer. The second polarizer is configured to be combined with the first polarizer to cause light passing through the second polarizer to be transmitted through the first regions of the first polarizer and to be blocked by the second regions of the second polarizer.

Another aspect of the present disclosure provides a method for fabricating a display panel. The method includes: providing a first substrate; forming a plurality of color films including color film regions and light shielding regions on the first substrate; and forming a first polarizer on one side of the substrate. The first polarizer includes a plurality of first regions corresponding to the color film regions and a plurality of second regions corresponding to the light shielding regions. The direction of the polarization axis of the second regions of the first polarizer is different from the polarization direction of the first regions of the first polarizer. The method further includes: providing a second substrate; forming a second polarizer on the top of the second substrate. The second polarizer is configured to be combined with the first polarizer to cause light passing through the second polarizer to be transmitted through the first regions of the first polarizer and to be blocked by the second regions of the second polarizer.

Another aspect of the present disclosure provides a display device. The display device includes a display panel described in the present disclosure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
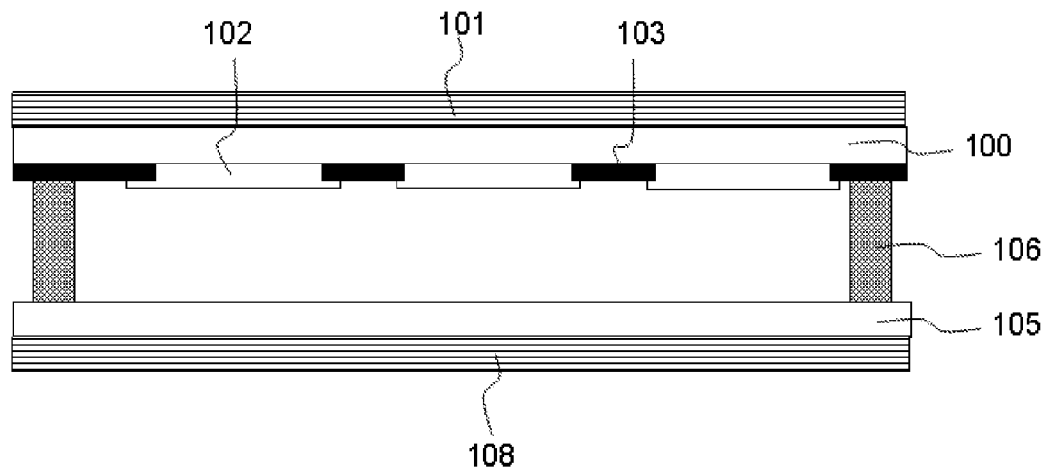
FIG. 1 illustrates a schematic cross-section view of a portion of a traditional liquid crystal display panel.

FIG. 1 shows a schematic structure view of a portion of a current display panel. Referring to FIG. 1, the display panel includes a color film substrate (CF substrate) 100 and an array substrate (TFT substrate) 105. The CF substrate 100 is an upper substrate, and the TFT substrate 105 is a lower substrate. Liquid crystals (not shown) are located between the CF substrate 100 and the TFT substrate 105. Frame glue 106 is used to bond the upper substrate and the lower substrate. A number of color films 102 and a black matrix 103 are formed on the top of the CF substrate 100. A polarizer 101 and a polarizer 108 are formed on the two opposite side surfaces of the CF substrate 100 and the TFT substrate 105, respectively. As shown in FIG. 1, overlapping between the color films 102 and black matrix 103 may occur.

Figure 2:
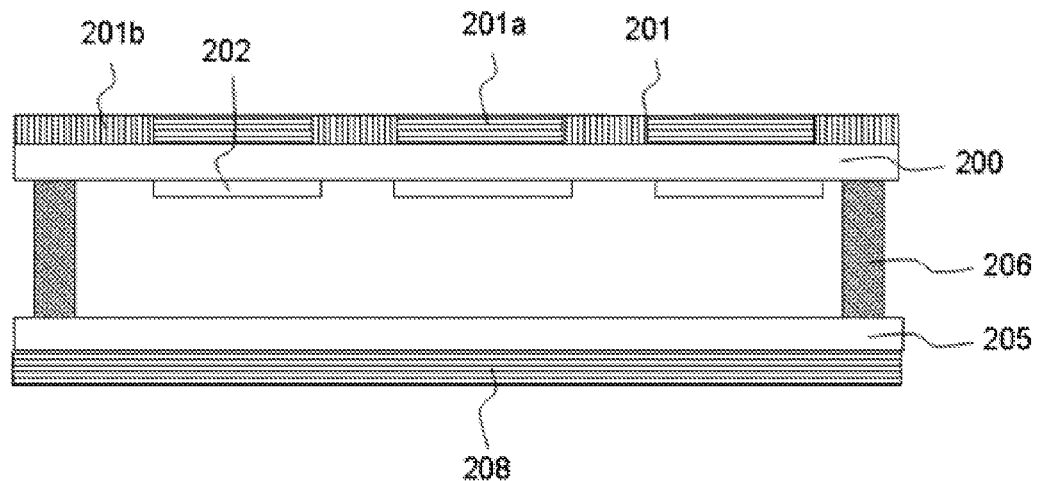
FIG. 2 illustrates a schematic cross-section view of the structure of a display panel consistent with disclosed embodiments.

FIG. 2 shows a schematic cross-section view of an exemplary panel of one embodiment consistent with the present disclosure. Referring to FIG. 2, the disclosed display panel may include a color film substrate (CF substrate) 200 and an array substrate (TFT substrate) 205. The CF substrate 200 may be referred as an upper substrate and the TFT substrate may be referred as a lower substrate.

Liquid crystals (not shown) are located between the CF substrate 200 and the TFT substrate 205, and frame glue 206 is used to bond the upper substrate and the lower substrate. Further, a number of color films 202 are formed on the top of the CF substrate 200 and the regions on the CF substrate containing color films are called color film regions. A number of discrete regions are also formed between neighboring color films 202 and the discrete regions are called light shielding regions.

On both polarizers, the regions corresponding to the color film regions are called first regions while the regions corresponding to the light shielding regions are called second regions. The polarization direction of the second regions in a first polarizer is perpendicular to the polarization direction of the second regions in a second polarizer.

In one embodiment, a first polarizer 201 is coupled to the CF substrate 200, and a second polarizer 208 is coupled to the TFT substrate 205. The first regions in the first polarizer 201 are called regions 201a while the second regions in the first polarizer 201 are called regions 201b. The polarization direction of the second regions 201b of the first polarizer 201 may be along a perpendicular direction, thus only light beams with a perpendicular polarization direction are allowed to be transmitted, while light beams with a parallel polarization direction are blocked or shielded. The polarization of the second polarizer 208 is along a parallel direction, thus light shielding effect may be achieved through the first polarizer 201 and the second polarizer 208.

When light passes through a first polarizer, the light beams with a polarization direction perpendicular to the transmission axis of the first polarizer are absorbed. When light further passes through a second polarizer with a transmission axis having a certain angle with respect to the transmission axis of the first polarizer, a certain percentage of the light is then shielded. In one embodiment, by setting the polarization direction of the second regions of the first polarizer to be perpendicular to the polarization direction of the second regions of the second polarizer, no light is allowed to pass through the second regions, thus light shielding effect is achieved for the second regions. Comparing to using a physical object such as a BM to shield light, using a combination of polarizers with different polarization axes to realize light shielding can save the process for forming a BM, and also makes the device thinner and lighter. In addition, the disclosed method of using a physical object such as a BM to shield light often affects the quality of display. For instance, using a BM as the light shielding regions may cause an uneven color film formed on the top of the BM, thus easily leading to color mixing during display. With no additional physical film layer required, the disclosed method provided in the present disclosure not only realizes light shielding but also avoids affecting the quality of display.

Optionally, the polarization direction of the second regions of the first polarizer and the polarization direction of the first regions of the first polarizer may be different. During actual display, there are two display modes: a black state display mode and a white state display mode. The black state refers to a mode with the polarization direction of the upper polarizer perpendicular to that of the lower polarizer, while the white state refers to a mode with the polarization direction of the upper polarizer parallel to that of the lower polarizer. In current technology, because a polarizer only has a single polarization direction, whenever a black state or a white state is set, the polarization direction of the first polarizer with respect to the polarization direction of the second polarizer is then defined, the second regions of the first polarizer alone cannot cooperate with the second polarizer. For example, once a white state mode is set, the polarization directions of the two polarizers in the second regions cannot be perpendicular to each other.

Using the polarizers provided in the present disclosure, the polarization directions in different regions of a single polarizer may be different, thus the problem discussed above can be resolved. For example, in one embodiment, the polarization of the second region 201b of the first polarizer is along a vertical direction, the polarization of the second polarizer is along a horizontal direction, and the polarization of the first region 201a of the first polarizer is also along a horizontal direction. Alternatively, the polarization of the first polarizer is along a horizontal direction and the polarization of the first region of the second polarizer is also along a horizontal direction but the polarization of the second region of the second polarizer is along a perpendicular direction.

Figure 3:
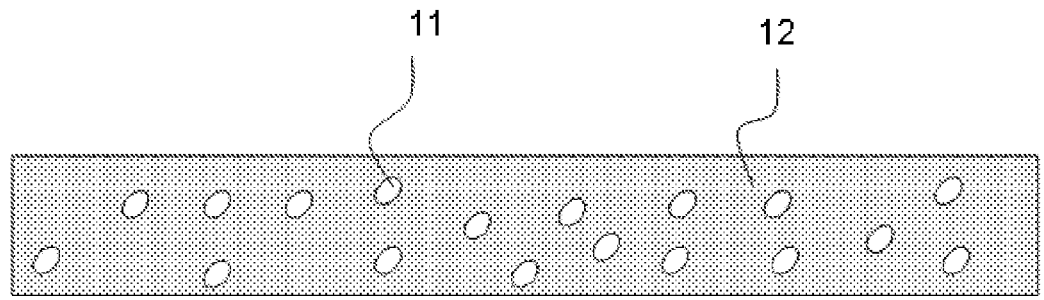
FIG. 3 illustrates a schematic cross-section view of the polarizer in the display panel shown in FIG. 2.

FIG. 3 shows a schematic cross-section view of an exemplary polarizer consistent with the disclosed embodiments. The polarizer includes polarizing material 11 and base material 12. The polarizing material 11 may be a dichroic organic dye. Optionally, the polarizing material 11 may be one or more of azo dye, anthraquinone dye, biphenyl dye, triphenyl diozaine and its derivative dye, single or multiple methane dye, poly ring dye, and stilbene, etc. Optionally, the dichroic ratio of the polarizing material 11 is greater than 7.

Optionally, the base material 12 may be one or more of cellulose triacetate, polyimide, polyamide acid, polystyrene, cellulose derivatives, polyvinyl chloride, polypropylene, acrylic polymer, polyamide, polyester, ethylene—vinyl acetate copolymer and its saponified material, etc. At least one of the polarizing material 11 and the base material 12 has photo-alignment properties.

For example, when the polarizing material 11 is made of an azo dichroic organic dye or a stilbene type dichroic dye, the polarizing material 11 has photo-alignment properties; when the base material 12 is polyimide with thietanyl groups, photo-alignment material with azo groups, or poly cinnamoyl and its derivatives, the base material 12 has photo-alignment properties. In present disclosure, after pre-baking the polarization layer, polarized ultraviolet light irradiation is used to align the polarizing material 11 and base material 12 along certain direction. With the dichroic properties of the polarizing material 11, the structure finally becomes a polarizer after completing a curing baking process. Optionally, the polarizing material 11 and the base material 12 may both have photo-alignment properties.

Under ultraviolet light irradiation, polarizing material 11 is aligned along a direction in coordination with the polarization direction of the ultraviolet light; in the meantime, the base material 12 is also aligned to the polarization direction of the ultraviolet light. The base material 12 is usually a polymer material while the polarizing material 11 is often a small molecule material. During the alignment process, the base material 12 guides the alignment of the polarizing material 11 while the polarizing material 11 coordinates with the alignment process of the base material 12, thus both the polarizing material 11 and the base material 12 are more precisely aligned. Therefore, the polarization directions of different regions of the polarizer in the present disclosure can be precisely defined based on actual needs.

Further, in the present embodiment, the accuracy of regionalization and the stability of the polarizer are improved. Optionally, the base material may be polyimide. Polyimide has strong high temperature and high humidity capability. The high temperature and high humidity capability of polyimide is better than that of the widely-used polyvinyl alcohol in current technology, thus polyimide has better reliability. In addition, the thickness of polyimide may also be smaller than that of polyvinyl alcohol, making the polarizer further thinner.

In the present disclosure, following a photo-alignment process, a polarizer is aligned under the irradiation of polarized ultraviolet light; a curing baking process is then performed to eventually form the polarizer. The polarization directions of different regions of the polarizer may be different by irradiating the regions with ultraviolet light with different polarization directions.

In certain other embodiments, the polarizer may have three or more regions. The direction of polarization axis of each region may be different from the direction of the polarization axis of any other region of the polarizer. Alternatively, the directions of the polarization axes of some regions are the same while the directions of the polarization axes of other regions are different. In the present disclosure, this kind of polarizer is referred to a regional polarizer.

Figure 4:
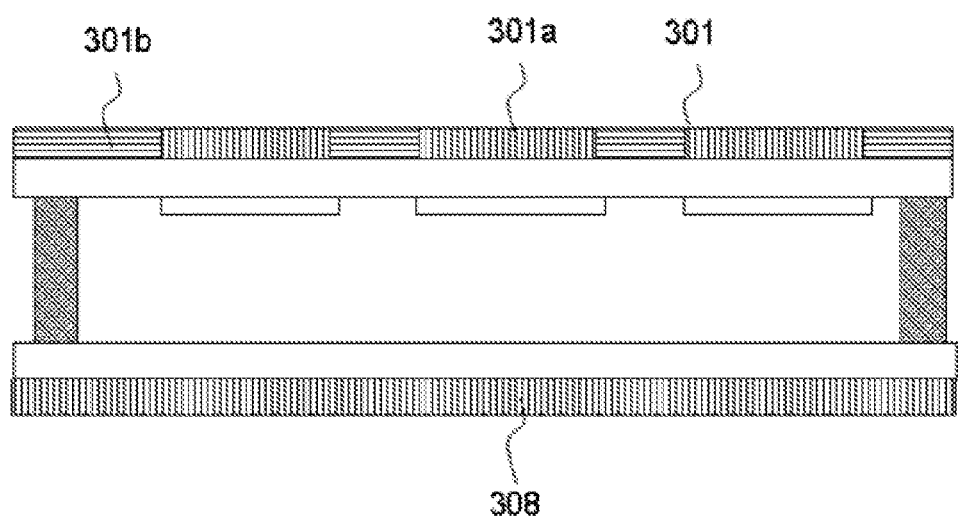
FIG. 4 illustrates a schematic cross-section view of the structure of a display panel consistent with disclosed embodiments.

FIG. 4 shows a schematic cross-section view of a display panel consistent with the present disclosure. Referring to FIG. 4, the polarization axis of a first region 301a of a first polarizer 301 is along a vertical direction; the polarization axis of a second region 301b of the first polarizer 301 is along a horizontal direction; and the polarization axis of a second polarizer 308 is along a vertical direction.

Because, in the second region, the polarization axes of the first polarizer 301 and the second polarizer 308 are perpendicular to each other, thus no light will be transmitted through the second region. However, in the first region, the polarization axes of the first polarizer and the second polarizer are parallel to each other, thus a white state mode is realized. Alternatively, in the present embodiment, the polarization axis of the first polarizer can also be along a vertical direction; correspondingly, the polarization axis of the first region of the second polarizer is along a vertical direction while the polarization axis of the second region of the second polarizer is along a horizontal direction.

In one embodiment of the present disclosure, both the first polarizer 301 and the second polarizer 308 may be regional polarizers. For example, FIG. 5 shows a schematic cross-section view of a display panel with two regional polarizers.

Figure 5:
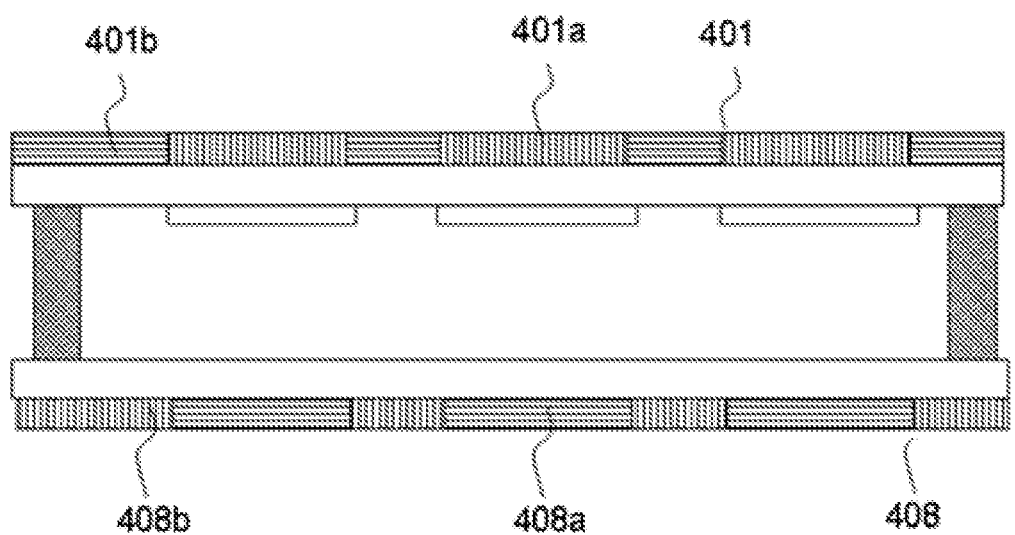
FIG. 5 illustrates a schematic cross-section view of the structure of a display panel consistent with disclosed embodiments.

Referring to FIG. 5, the polarization axis of a first region 401a of a first polarizer 401 is along a vertical direction, the polarization axis of a second region 401b of the first polarizer 401 is along a horizontal direction, the polarization axis of a first region 408a of a second polarizer 408 is along a horizontal direction, and the polarization axis of a second region 408b of the second polarizer 408 is along a vertical direction. The combination of the two polarizers with these specific polarization arrangements may realize the light shielding effect in a black state mode.

Figure 6:
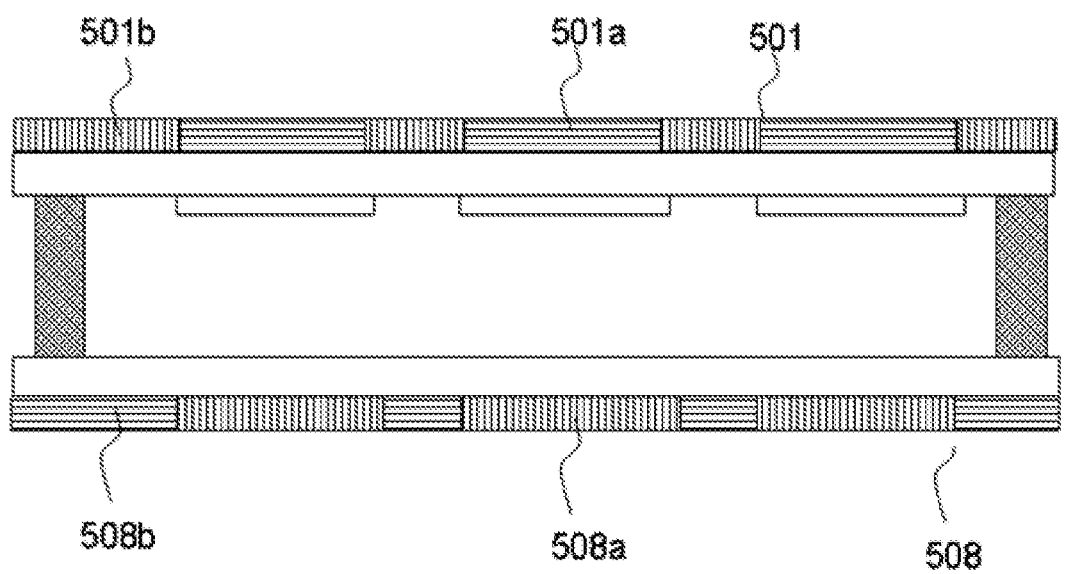
FIG. 6 illustrates a schematic cross-section view of the structure of a display panel consistent with disclosed embodiments.

In one embodiment of the present disclosure, both the first and the second polarizers are regional polarizers. For example, FIG. 6 shows a schematic cross-section view of a display panel with two regional polarizers. Referring to FIG. 6, the polarization axis of a first region 501a of a first polarizer 501 is along a horizontal direction, the polarization axis of a second region 501b of the first polarizer 501 is along a vertical direction, the polarization axis of a first region 508a of a second polarizer 508 is along a vertical direction, and the polarization axis of a second region 508b of the second polarizer 508 is along a horizontal direction. The combination of the two polarizers with these specific polarization arrangements may realize the light shielding effect in a black state mode.

Accordingly, the combination of the polarizers in the present disclosure can realize the light shielding effect. Alternatively, a BM may also be used to assist light shielding. Because the polarizers used alone can shield light, the BM used in one embodiment of the present disclosure may have a width narrower than that of the BM used in current technology. As an option, the width of the BM may be smaller than 2 μm. Reducing the width of the BM may improve the transmittance of light. In addition, the combination of polarizers in the present disclosure may achieve better contrast and higher aperture ratio.

The combination of the polarizers in the present disclosure can be formed on the two inner surfaces of the CF substrate and the TFT substrate with one surface facing to the other. The combination of the polarizers can also be formed on the two outer surfaces of the CF substrate and the TFT substrate with the two surfaces on the two opposite sides of the display panel. The combination of the polarizers can also be formed with one polarizer on an inner surface of one of the CF substrate and the TFT substrate with the surface facing to the other substrate while the other polarizer on an outer surface of the other substrate of the CF substrate and the TFT substrate. In current technology, polarizers can usually be formed on the two opposite surfaces of the CF substrate and the TFT substrate because polarizers are often pasted onto display panel, thus a smooth surface is required for pasting in order to achieve an ideal optical effect. In the present disclosure, polarizers are formed by doping the base material 12 with polarizing material 11 and may be coated on the display panel, thus polarizers can be formed on the two faced-up surfaces of the CF substrate and the TFT substrate. The coating method not only can be used on non-smooth surfaces, but also avoids undesired optical effect caused by defects in traditional polarizers such as attaching error, bubble, etc. thus the matching precision between the polarizer and the display panel is improved. In addition, pasting polarizers on the inner surfaces of the panel may also prevent the polarizer from falling off or being scratched.

Optionally, the CF substrate further includes a first organic layer. The first organic layer is located on the top of the color film and may be made of resin materials. Optionally, the TFT substrate may also include a second organic layer. The second organic layer is located on the top of the thin-film transistors and may be made of resin materials. In one embodiment, polarizing material 11 is doped into the first organic layer and/or the second organic layer. The polarizing material 11 is a dichroic dye having photo-alignment properties. Under the irradiation of ultraviolet light, the polarizing material 11 is aligned along certain direction so that it functions as a polarizer. Optionally, the base material 12 is doped into the first organic layer and/or the second organic layer. The base material 12 has photo-alignment properties. For example, the base material 12 may be polyimide.

Optionally, the first organic layer and the second organic layer are made of polyimide and may be doped with polarizing material 11. The polarizing material 11 is a dichroic dye having photo-alignment properties. In the present embodiment, the first organic layer is also used as the first polarizer and the second organic layer is used as the second polarizer. This specific structure saves manufacturing procedures for polarizer, improves the productivity; in addition, the structure also reduces the thickness of the display panel, leading to a lighter and thinner panel. Similarly, polarizing material 11 and base material 12 may also be doped in any layer of the display panel. The first polarizer and the second polarizer may be regional polarizers described in the embodiments of the present disclosure.

Further, electrodes may be formed on at least one of the CF substrate and the TFT substrate. Optionally, the electrodes may be pixel electrodes and common electrodes. Based on the position and the structure of electrodes, a liquid crystal display monitor may have different display modes, including a TN mode (twisted nematic liquid crystal mode), a VA mode (vertical alignment mode), and an IPS mode (in-plane switching mode), etc.

Figure 7:
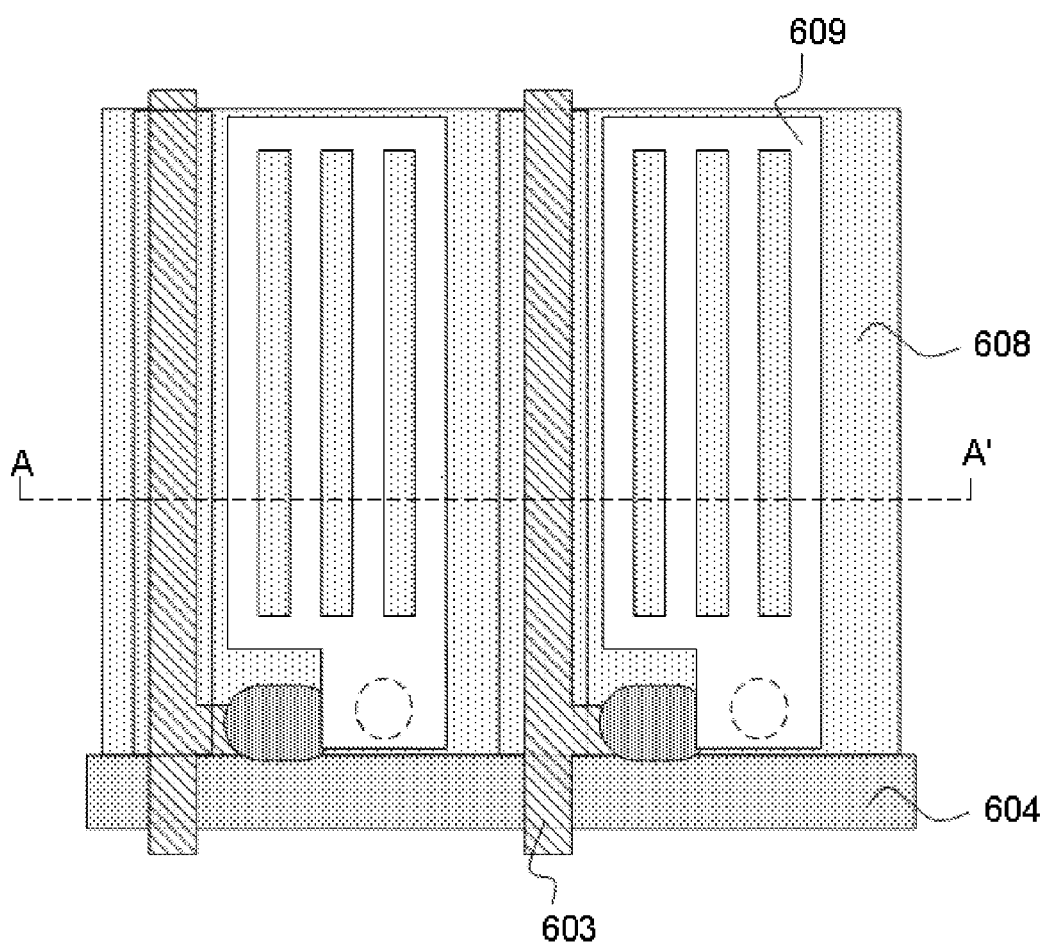
FIG. 7 illustrates a schematic top view of pixel units on a display panel consistent with disclosed embodiments.

FIG. 7 shows a schematic top view of a display panel consistent with the disclosed embodiments of the present disclosure. Referring to FIG. 7, each pixel unit has a data line 603. A gate line 604 crosses the data line 603 with electric insulation. The area enclosed with the data line 603 and the gate line 604 is a pixel unit. A thin-film transistor (not labeled) is formed at the cross point of the data line 603 and the gate line 604. The thin-film transistor includes a gate electrode, a source, a drain, and an active layer.

Figure 8:
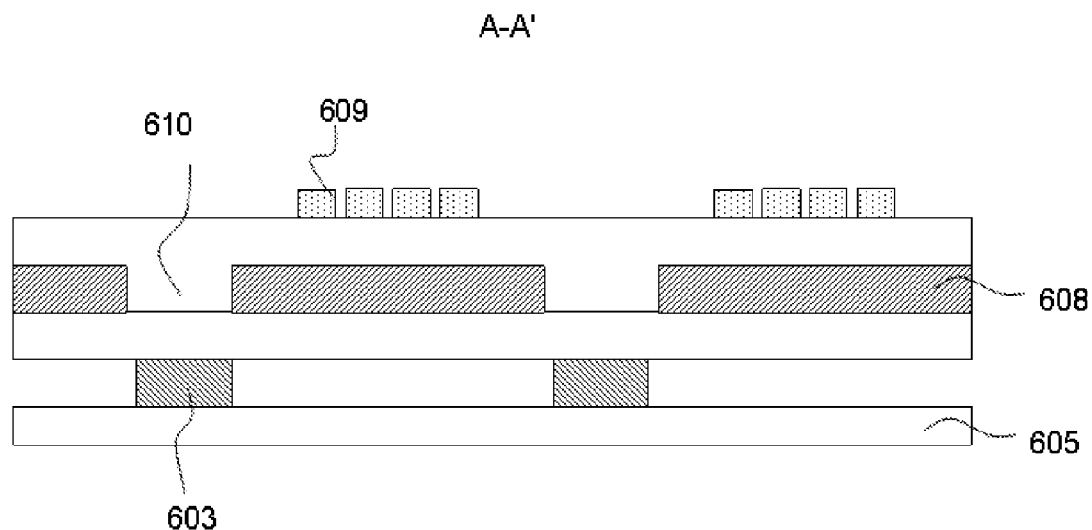
FIG. 8 illustrates a schematic cross-section view of the pixel units on a display panel shown in FIG. 7 along the A-A' line.

FIG. 8 shows a schematic cross-section view of the structure shown in FIG. 7 along the A-A' line. Referring to FIG. 8, the data lines 603 are located on the top of the substrate 605. A number of first electrodes 608 with a sheet shape are formed above the data lines 603 and a number of second electrodes 609 are formed above the first electrodes 608. An insulating layer is formed between the first electrodes 608 and the second electrodes 609. Each data line on the TFT substrate corresponds to a light shielding region on the CF substrate.

Optionally, electrode may not be formed at areas corresponding to the light shielding regions on the CF substrate so that when a voltage is applied to the panel, no electric voltage is generated in the areas corresponding to the light shielding regions. With no voltage generated in these regions, rotation of liquid crystal molecules is avoided, thus effective light shielding by the combination of the upper and the lower polarizers is ensured. Optionally, the electrodes corresponding to the light shielding regions may have a trench and the trench may reduce the voltage in the region. In one embodiment, each first electrode 608 corresponding to a light shielding region have a trench 610 to reduce the voltage in the region.

The corresponding relationship between the CF substrate and the TFT substrate is that the color film region of the CF substrate corresponds to the pixel unit region of the TFT substrate. During display, this region may show images with different brightness depending on the amplitude of the voltage applied. A data line is formed between each pair of neighboring pixel units and the data line corresponds to a light shielding region on the CF substrate. Usually, the area of the light shielding region is greater than the width of the data line. Optionally, the width of the second regions of the polarizer may be wider than the width of the data line. In traditional panels, the random rotation of the liquid crystals above the data line often leads to abnormal display, and using the design of the present disclosure can effectively reduce such abnormal display.

According to another embodiment of the present disclosure, the first electrodes and the second electrodes of the display panel are both strip electrodes such as the frequently used comb-shaped electrodes in the IPS mode. Optionally, electrodes may not be formed at areas corresponding to the light shielding regions on the CF substrate. Because the first electrodes and the second electrodes are both strip electrodes, no additional etching process is required to make the areas that correspond to the light shielding regions clear, without having any electrode. Therefore, the method of the present disclosure does not induce any extra manufacturing procedure and, in the meantime, it can still avoid generating voltages in areas that correspond to the light shielding regions.

Figure 9:
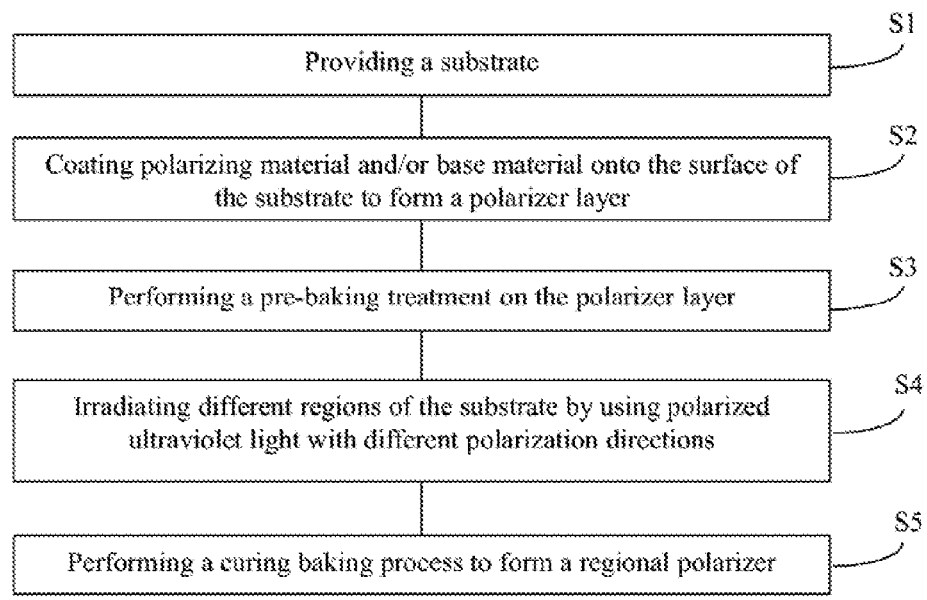
FIG. 9 illustrates an exemplary fabrication process of a regional polarizer consistent with disclosed embodiments.

The present disclosure also provides a method for fabricating regional polarizers. FIG. 9 shows an exemplary fabrication process of a regional polarizer in one embodiment of the present disclosure.

Referring to FIG. 9, at the beginning of the fabrication, a substrate is provided (S1). Any appropriate substrate may be used.

Further, a polarizer layer is formed on the surface of the substrate (S2). For example, the polarizer layer may be formed by either coating polarizing material 11 onto the surface of the substrate or by mixing the polarizing material 11 into base material 12 or its precursor and then coating the mixture onto the surface of the substrate.

Specifically, the polarizing material 11 and the base material 12 may be any combination of the materials described previously.

Further, a pre-baking treatment is conducted on the polarizer layer (S3). During the pre-baking treatment process, a temperature of 90° C.-130° C. and a baking time of 60 s-120 s may be used.

After pre-baking treatment, polarized ultraviolet light may be used to irradiate the substrate with the polarizer layer (S4).

For a regional polarizer, the polarizer may be divided into at least two regions. In one embodiment, the polarizer is divided into two regions: a first region and a second region.

The two regions are then individually irradiated by ultraviolet light with distinct polarization directions.

For example, ultraviolet light polarized along a first direction is used to irradiate the first region. Further, the polarizer is rotated by a certain angle so that the angle between the polarization direction of the ultraviolet light and the polarizer is changed. Further, the ultraviolet light with the same polarization direction is used to irradiate the second region. Because the angle between the polarization direction of the ultraviolet light and the substrate has been changed, the polarization axis of the second region is different from that of the first region.

Alternatively, the two different polarization directions of the two regions may also be achieved through the following procedures: first, ultraviolet light polarized along a first direction is used to irradiate the first region; further, the metal grating of the ultraviolet light source is rotated to obtain ultraviolet light polarized along a second direction; then, the ultraviolet light polarized along the second direction is used to irradiate the second region.

In addition, a regional mask may be used to define the two distinct polarization directions for the two regions. For example, a regional mask used to define two distinct polarization directions includes a plurality of pre-defined first regions and a plurality of pre-defined second regions. The first regions of the mask contain metal gratings arranged along a first direction while the second regions of the mask contain metal gratings arranged along a second direction. Further, the mask may be placed between an ultraviolet light source and the regional polarizer to be made so that after irradiation, regions of the polarizer corresponding to the first regions of the mask are polarized along the first direction and regions of the polarizer corresponding to the second regions of the mask are polarized along the second direction. As such, a regional polarizer with two polarization directions is fabricated.

Specifically, using polarized ultraviolet light to irradiate the polarizer after the pre-baking treatment process, the polarizing material and the/or the base material are aligned along certain polarization directions. During the irradiation process, the energy of the polarized ultraviolet light may be in a range of 300 mJ-1000 mJ. In one embodiment, the energy of the polarized ultraviolet light is in a range of 500 mJ-800 mJ. Under this illumination energy, the photo-alignment properties of the polyimide film are desired, thus it is more beneficial to the alignment of the azo dye, leading to the desired polarization performance.

After irradiation by polarized ultraviolet light, a curing baking process may be performed to finally form the regional polarizer (S5).

During the curing baking process, the curing baking temperature may be in a range of 90° C.-130° C. and the curing baking time may be in a range of 20 min-50 min. In one embodiment, the pre-baking temperature is 130° C. and the pre-baking time is 120 s while the curing baking temperature is 230° C. and the curing baking time is 30 min.

The present disclosure further includes a method for fabricating a display panel. The method includes: providing a first substrate; forming color films on the first substrate with the color films including color film regions and light shielding regions; forming a first polarizer on one side of the first substrate; proving a second substrate; forming a second polarizer on the second substrate with the second polarizer including first regions and second regions corresponding to the color film regions and the light shielding regions, respectively. The polarization direction of the second regions of the first polarizer is perpendicular to the direction of the polarization axis of the second regions of the second polarizer while the direction of the polarization axis of the second regions of the first polarizer is different from the polarization direction of the first regions of the first polarizer. Alternatively, the direction of the polarization axis of the second regions of the first polarizer is perpendicular to the polarization direction of the first regions of the first polarizer.

Figure 10:
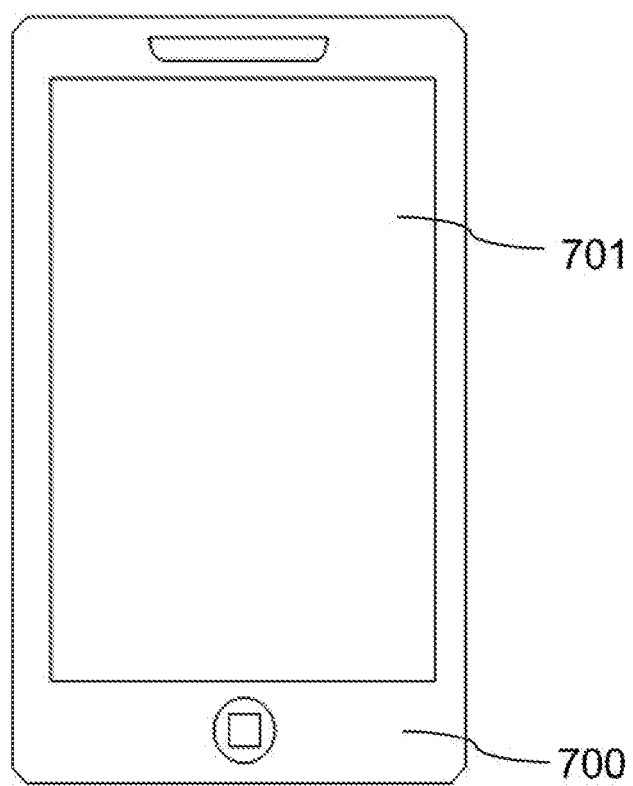
FIG. 10 illustrates a schematic structural view of an exemplary display device consistent with disclosed embodiments.

The present disclosure also provides a display device. As an example, shown in FIG. 10, a cellphone device 700 includes the above described display panel 701. In other embodiments, the disclosed display panel may also be adopted in devices with display screens, such as television, computer monitor, etc.

By using the disclosed display panel and fabrication methods, light shielding effect can be realized without having a BM in the structure. Therefore, the fabrication process for the BM in the current technology is eliminated, thus problems such as abnormal alignment and light leaking due to bulges emerged from overlapping areas between the BM and the color films are avoided, and in the meantime, the display panel becomes thinner and lighter.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A display panel, comprising:
   a first substrate;
   a second substrate arranged corresponding to the first substrate;
   a plurality of color films formed on one side of the first substrate and dividing the first substrate into a plurality of color film regions and a plurality of light shielding regions;
   a first polarizer formed on the first substrate; and
   a second polarizer formed on the second substrate, wherein:
      the first polarizer includes a plurality of first regions corresponding to the color film regions and a plurality of second regions corresponding to the light shielding regions;
      the direction of the polarization axis of the second regions of the first polarizer is different from the polarization direction of the first regions of the first polarizer;
      the second polarizer is configured to be combined with the first polarizer to cause light passing through the second polarizer to be transmitted through the first regions of the first polarizer and to be blocked by the second regions of the first polarizer; and
   a plurality of electrodes are formed on a plurality of electrode regions of the second substrate, the electrode regions of the second substrate are at projecting positions corresponding to the color film regions of the first substrate, and no electrode is formed on areas of the second substrate at projecting positions corresponding to the light shielding regions of the first substrate.

2. The display panel according to claim 1, wherein:
the second polarizer includes a plurality of first regions corresponding to the color film regions and a plurality of second regions corresponding to the light shielding regions;
the direction of the polarization axis of the second regions of the first polarizer is perpendicular to the polarization direction of the second regions of the second polarizer; and
the direction of the polarization axis of the first regions of the first polarizer is perpendicular to the polarization direction of the first regions of the second polarizer.

3. The display panel according to claim 1, wherein at least one of the first polarizer and the second polarizer are aligned under irradiation of polarized ultraviolet light.

4. The display panel according to claim 1, wherein the first polarizer and the second polarizer include a base material and a polarizing material; and the polarizing material is doped into the base material.

5. The display panel according to claim 4, wherein the polarizing material is a dichroic organic dye or a stilbene type dichroic dye.

6. The display panel according to claim 4, wherein the base material is polyimide, a poly cinnamoyl derivative, or an azo type photo-alignment material.

7. The display panel according to claim 1, wherein the color films are formed on
the first substrate and the display panel further includes:
a first organic layer formed on the color films;
a plurality of pixel units formed on the second substrate;
a plurality of data lines formed between neighboring pixel units;
a plurality of thin-film transistors formed on the second substrate with each thin-film transistor having a gate electrode, an active layer, and a source and a drain located on the active layer;
a second organic layer formed on the thin-film transistors;
a plurality of first electrodes formed on the top of the second organic layer; and
a plurality of second electrodes formed above the first electrodes.

8. The display panel according to claim 7, wherein the data lines are covered by the second regions.

9. The display panel according to claim 7, wherein both the first electrodes and the second electrodes have a strip shape.

10. The display panel according to claim 7, wherein both the first electrodes and the second electrodes are common electrodes and areas corresponding to the light shielding regions have trenches.

11. The display panel according to claim 7, wherein the first polarizer or the second polarizer is formed in a same layer of the first organic layer or the second organic layer.

12. A display device including the display panel according to claim 1.

13. A method for fabricating a display panel, comprising:
providing a first substrate;
forming a plurality of color films including color film regions and light shielding regions on the first substrate;
forming a first polarizer on one side of the first substrate; and
providing a second substrate;
forming a second polarizer on the top of the second substrate, wherein:
the first polarizer includes a plurality of first regions corresponding to the color film regions and a plurality of second regions corresponding to the light shielding regions;
the direction of the polarization axis of the second regions of the first polarizer is different from the polarization direction of the first regions of the first polarizer;
the second polarizer is configured to be combined with the first polarizer to cause light passing through the second polarizer to be transmitted through the first regions of the first polarizer and to be blocked by the second regions of the first polarizer; and
a plurality of electrodes are formed on a plurality of electrode regions of the second substrate, the electrode regions of the second substrate are at projecting positions corresponding to the color film regions of the first substrate, and no electrode is formed on areas of the second substrate at projecting positions corresponding to the light shielding regions of the first substrate.

14. The method according to claim 13, wherein:
the second polarizer includes a plurality of first regions corresponding to the color film regions and a plurality of second regions corresponding to the light shielding regions;
the direction of the polarization axis of the second regions of the first polarizer is perpendicular to the polarization direction of the second regions of the second polarizer; and
the direction of the polarization axis of the first regions of the first polarizer is perpendicular to the polarization direction of the first regions of the second polarizer.

15. The method according to claim 13, further including:
forming a first organic layer on the color films;
forming a plurality of pixel units on the second substrate;
forming a plurality of data lines between neighboring pixel units;
forming a plurality of thin-film transistors on the second substrate with each thin-film transistor having a gate electrode, an active layer, and a source and a drain located on the active layer;
forming a second organic layer on the thin-film transistors;
forming a plurality of first electrodes on the top of the second organic layer; and
forming a plurality of second electrodes above the first electrodes.

* * * * *